June 4, 1963 M. E. JONES ETAL 3,092,591
METHOD OF MAKING DEGENERATIVELY DOPED GROUP III-V COMPOUND SEMICONDUCTOR MATERIAL
Filed March 21, 1960
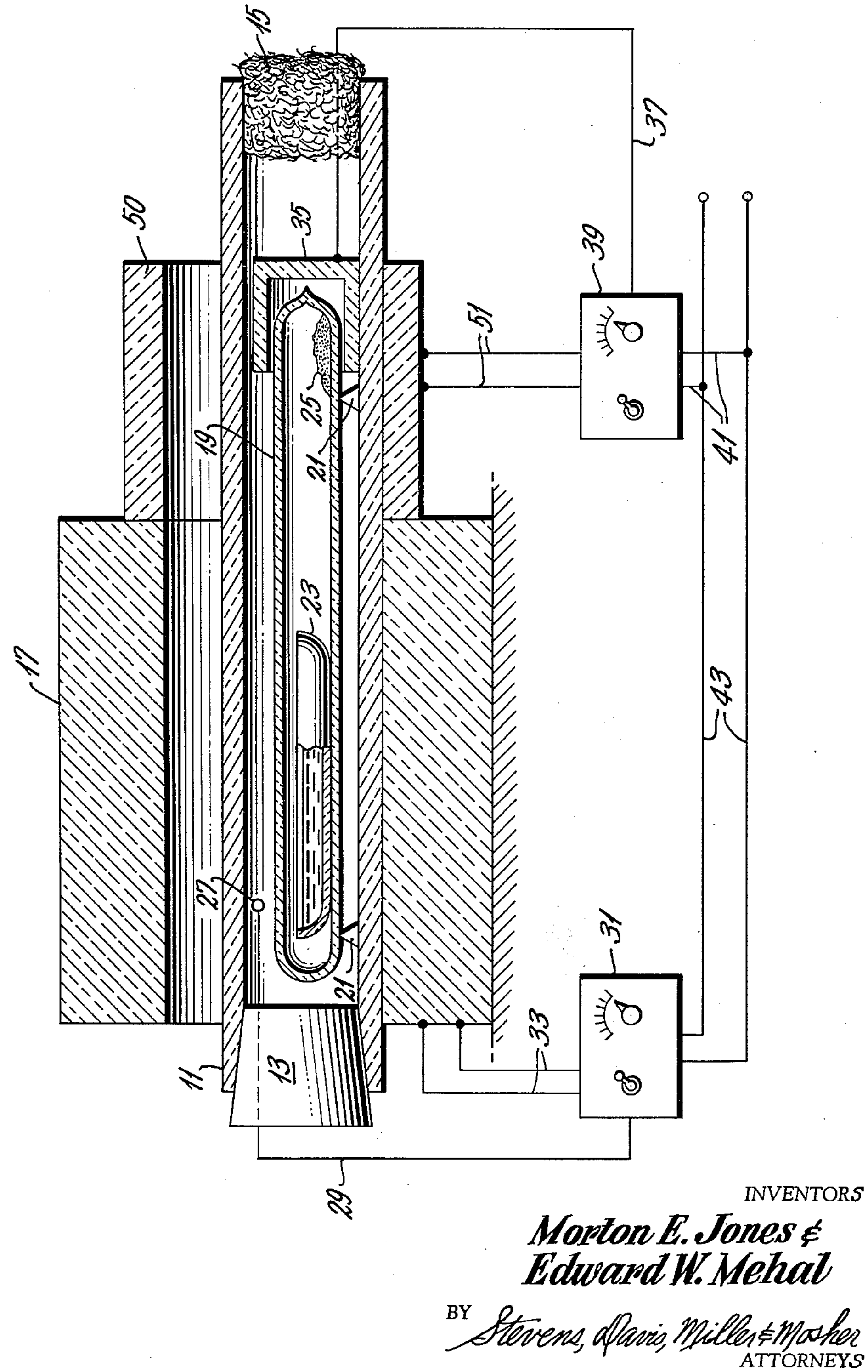
INVENTORS
Morton E. Jones &
Edward W. Mehal
BY Stevens, Davis, Miller & Mosher
ATTORNEYS United States Patent Office 3,092,591

Patented June 4, 1963

3,092,591

METHOD OF MAKING DEGENERATIVELY DOPED GROUP III-V COMPOUND SEMICONDUCTOR MATERIAL

Morton E. Jones, Richardson, and Edward W. Mehal, Dallas, Tex., assignors to Texas Instruments Incorporated, Dallas, Tex., a corporation of Delaware Filed Mar. 21, 1960, Ser. No. 16,345
5 Claims. (Cl. 252—518)

This invention relates to compound semiconductor materials and more particularly to the means and method for producing them.

Semiconductor materials have come into prominence recently because of their usefulness in making such devices as transistors, diodes, rectifiers, photoelectric devices, and thermoelectric devices among others.

Certain elements of group IV of the periodic table of elements, i.e. carbon, silicon, germanium and tin, have in common the characteristics requisite for semiconductor materials. (As used herein, the periodic table of elements shall mean that table according to Mendeleeff as now generally portrayed.) However, because of the difficulty of synthetic production of the diamond form of carbon and the instability of the diamond lattice in tin, the semiconductor materials first used, and now most commonly used, in devices of the type mentioned above are germanium and silicon.

Nevertheless, because of certain inherent limitations of germanium and silicon as semiconductor materials and because of the difficulties of producing and maintaining the diamond lattice structure in tin and carbon, experimenters have been diligently searching for other and better semiconductor materials. The so-called compound semiconductor materials which may be comprised, for example, of an element from group III and an element from group V of the periodic table as disclosed in U.S. Patent No. 2,798,989 to Welker, appear superior to the group IV semiconductors in many of their characteristics.

Despite the inherent advantages of the compound semiconductors, certain difficulties have prevented their use in semiconductor devices to any important degree, as yet. Among these are the difficulties of producing a material of the requisite purity required for the starting material used in device fabrication. Added to this are the difficulties of adding required amounts of significant impurities or "dopes" to the material to produce the p- and n-type regions required in useful devices. These difficulties have become especially troublesome in connection with the attempts to use the III—V compound semiconductor materials in devices requiring a relatively extremely high level of doping in the semiconductor material. A typical device requiring such high doping levels is the recently developed tunnel diode.

The tunnel diode is a crystal semiconductor device having a single, very sharp p-n junction with the material on either side of the junction "doped" to degeneracy, i.e. containing relatively large amounts of donor or acceptor impurities. The tunnel diode exhibits a current-voltage characteristic with a negative resistance region which is quite large, and thus is useful as an oscillator and as an amplifier.

Primarily, it has been attempted to produce in bodies of compound semiconductor material the doping levels required for tunnel diodes by solid state diffusion. By this method, a small slab of extremely pure compound semiconductor material was placed in a closed evacuated chamber together with an amount of a suitable doping material. (Suitable doping materials for III—V compound semiconductor materials are the elements of group II for acceptors and the elements of group VI for donors.) The chamber and its contents were then heated to a temperature slightly below the melting point of the semiconductor material, but sufficient to produce an atmosphere of the impurity wafer. The chamber was held at that temperature until enough of the impurity diffused into the semiconductor material to produce the required level of doping throughout the slab. This procedure usually required several days using temperatures of up to 1000° C. Further, after the diffusion process, it was necessary to lap, etch and clean the surface of the slab before it could be fabricated into a tunnel diode by alloying to the slab a small amount of opposite-type impurity to produce the other highly doped region and sharp p-n junction. In addition to the time element involved, other difficulties were present because of the extremely high vapor pressures produced by some impurities and the tendency of the semiconductor material to dissociate at the diffusion temperatures.

United States patent application Serial No. 16,572, filed March 21, 1960, by Johnson and Mehal, who is a co-inventor herein, discloses means of overcoming the above-mentioned difficulties by producing heavily doped compound semiconductor material through a procedure involving insertion of the doping material in one of the constituents of the compound, and thereafter causing the compound semiconductor material to form and an ingot of the doped compound semiconductor to freeze from the stoichiometric melt formed. Such an ingot will contain an amount of the doping material approaching the limit of solid solubility of the doping material in the compound.

It has been found by the present inventors that, for devices produced by some of the presently used procedures and materials, the doping levels achieved by the method disclosed in the above-mentioned application Serial No. 16,572 are too high, i.e., higher than the optimum doping level necessary to produce the highest quality devices possible using those particular procedures and materials. By the present invention, the doping of the compound semiconductor material produced can be controlled to a level below impurity saturation of the material, but still above the level required for the material to become degenerate. According to the present invention, the doped ingot produced is grown from a nonstoichiometric melt. The melt is caused to be nonstoichiometric by adjustment of certain times and control temperatures in the process of the above-referenced application Serial No. 16,572. Because of the difference in the segregation coefficients of the doping material in a freezing system wherein the melt is stoichiometric and a freezing system wherein the melt is nonstoichiometric, the ingot of material grown from a nonstoichiometric melt will contain a different concentration of impurities than the material grown from a stoichiometric melt.

Therefore it is one object of the present invention to provide a method to form compound semiconductor material containing a high level of doping impurities.

Another object of the present invention is to provide a method of forming a compound semiconductor which is doped to a level of degeneracy.

Still another object of the present invention is to provide a method of producing a doped compound semiconductor ingot from which various semiconductor devices and especially tunnel diodes can be formed directly without resort to crystal growing processes.

A further object of the present invention is to provide a method of growing a large crystal compound semiconductor from a nonstoichiometric melt such that the compound semiconductor is doped to degeneracy.

A still further object of the present invention is to provide a method for forming a compound semiconductor material containing impurity levels approaching the maximum solubility limit of that impurity in the solid compound semiconductor.

A still further object of the present invention is to provide a method of forming compound semiconductor material having the requisite impurity level required for direct fabrication into tunnel diodes.

Other objects and advantages of this invention will become apparent as the following description proceeds, which description should be taken together with the accompanying drawings, in which the single FIGURE is a sectional view of apparatus for producing semiconductor material in accordance with the principles of this invention.

The present invention will be disclosed with specific reference to gallium arsenide as the compound semiconductor material. The principles involved may readily be seen to be applicable to other binary compound semiconductors such as, for example, indium phosphide, gallium phosphide, indium antimonide, gallium antimonide, and others, as well as to three or more element compound semiconductors.

The apparatus illustrated in the drawing illustrates one manner in which a compound semiconductor material may be formed which is doped to degeneracy but below the limit of solubility of the doping material. This apparatus comprises a ceramic tube 11, of generally cylindrically form, which may be closed at one end by a suitable plug 13 and at the other end by a plug 15 of quartz or glass wool to prevent cool air currents through the tube. The tube 11 is at least partially situated within a furnace 17 of ceramic, metal, or other such material. A second furnace 50 surrounds another portion of the tube 11 as shown. Within the tube 11 is a sealed quartz reaction chamber 19 resting upon supports 21 within the tube 11. The sealed chamber or bomb tube 19 contains at one end, well within the furnace 17, a quartz boat 23, and at its other end, which is exterior to the furnace 17 but within the furnace 50, a quantity of the more volatile element of the compound semiconductor to be formed which, in the case of gallium arsenide, is arsenic. A thermocouple 27, connected by a wire 29 to a temperature control 31, is mounted within the tube 11 and controls the temperature at one end of the furnace 17 through control of the power delivered to the furnace through wires 33. A support 35 surrounding the other end of the sealed chamber or bomb tube 19 contains a second thermocouple which is connected by means of a wire 37 to a second temperature control 39 to control the temperature of a second furnace 50 by control of the power delivered to the furnace through wires 51. Wires 43 serve the furnaces and the temperature controls with electrical energy.

The boat 23 within one end of the sealed chamber 19 contains an amount of one element of the compound semiconductor and an "excess" amount of the doping agent. By an "excess" amount of doping agent is meant that amount of the agent required to exceed the solubility of the particular doping agent in the total amount of solid compound semiconductor material which will be formed within the boat 23. The material 25 at the other end of the sealed chamber 19 is the more volatile element of the compound semiconductor to be formed. By way of illustration, the boat 23 may contain a mixture of gallium and tellurium or gallium and zinc, and the material 25 may be arsenic or phosphorus. The temperature control 31 is adjusted to maintain a temperature of the boat 23 above the melting point of the compound semiconductor material to be formed. In the case of gallium arsenide the melting point is approximately 1234° C. The furnace 17 is so constructed that a 20–45° C. temperature gradient from one end to the other of the boat 23 is maintained. Such a temperature gradient may be achieved through proper placement of the heating coils of the furnace or by other known means. The hotter end of the boat 23 may be maintained at approximately 1260–1265° C. for the case of gallium arsenside. The end of the sealed chamber 19 containing the material 25 should be maintained at a temperature at which the vapor pressure of the material 25 is correct to produce a nonstoichiometric of the compound semiconductor in the boat 23 from which an ingot is to be grown. For gallium arsenide the arsenic should be maintained at a temperature below 607° C. to insure a gallium rich melt. In this manner, the temperature at the cool end of the chamber 19 is sufficient to volatilize the material 25 which is contained therein and the temperature at the hot end of the chamber 19 containing the boat 23 is sufficient to maintain the contents of the boat above the melting temperature of the compound semiconductor material to be formed. At these temperatures, the volatilizing material 25 forms an atmosphere within the chamber 19 and combines with the element in the boat 23 to produce a nonstoichiometric molten compound semiconductor material containing an "excess" amount of doping agent.

After maintaining the molten material under the conditions outlined above for a period of time sufficient for a compound semiconductor material, about five hours, the melt is subjected to gradient freezing by gradually reducing the temperature in the furnace 17 over a period of from four to eight hours while maintaining substantially constant the temperature gradient of about 20°–25° C. across the boat 23. In this manner, the compound semiconductor material begins freezing at the cooler end of the boat 23, and progressively freezes until the temperature at the hotter end of the boat 23 falls below the melting temperature of the compound semiconductor material (about 1234° C. for gallium arsenide). Due to the segregation characteristics of the dope in the freezing material, the excess doping material will be swept by the advancing freezing interface of the crystalline mass to the last frozen end of the compound semiconductor material, providing a super-saturated portion of material at the finally frozen end of the crystalline mass.

The frozen mass will usually by polycrystalline. However, when slowly cooled as described, the individual crystals in the mass will be quite large, and, on occasions, the mass will seed itself and freeze as a single crystal. Alternatively, the molten mass can be seeded to cause a single crystal to grow during cooling.

By this method there is formed a crystalline mass of highly doped semiconductor material. Although the mass is polycrystalline, the individual crystals of the material are so large that slices of the material, as formed, are suitable for fabrication directly into devices such as tunnel diodes. After the formation of the crystalline mass itself, the first frozen end, in which the individual crystals are too small, and the finally frozen end, which is supersaturated with the doping material, may be cut off to leave the more desirable middle portion. This middle portion is then sliced and diced into wafers, which are then suitably etched and polished preparatory to producing devices. After preparation of the wafers, suitable contacts are attached to the wafer, one ohmic and one rectifying.

Leads are then attached to the contacts and the device is encapsulated to provide a finished product.

The process outlined above produces unusual and unexpected results when the control temperature of furnace 50 is so set that the ingot is grown from a nonstoichiometric melt. For example, in the production of a zinc-doped gallium arsenide ingot of about 50 grams using an arsenic control temperature in the range of from about 603° C. to about 605° C., it has been found that the gallium arsenide ingot produced contains less zinc than similar ingots produced by the method of the above-mentioned application Serial No. 16,572. The doping level produced by the present process, although lower than that produced by the process of application Serial No. 16,572 has been found to be the optimum doping level for the base material to be used in certain processes for making gallium arsenide tunnel diodes. The exact reason the present process produces a lower doping level in the ingot is not understood. It is known that the lower arsenic control temperature causes the melt from which the ingot is grown to be nonstoichiometric—gallium rich—as evidenced by small gallium inclusions in the ingot. It is speculated that the gallium rich melt favorably alters the segregation constant of the system causing less zinc to appear in the frozen gallium arsenide. The effect is so striking that lowering of the temperature by only a few degrees centigrade produces a change in the carrier concentration in the solidified gallium arsenide of about one order of magnitude. The practice of the former technique produces material having about $1.2\times10^{20}$ carriers per cubic centimeter, whereas the practice of the technique of this invention produces material having from about $10^{19}$ to about $5\times10^{19}$ carriers per cubic centimeter. The last-named figure is considered to be the optimum value for tunnel diode material for certain manufacturing processes.

Gallium arsenide has been used as a typical example of the compound semiconductor material which can be formed in this manner because gallium arsenide presents some of the greatest problems in achieving correct doping levels. The method of producing tunnel diode material by this invention has proved extremely useful not only with arsenic compound semiconductors but also with the phosphorus compound semiconductors and with others in which one of the elements has a higher vapor pressure than the other.

There now follow specific examples of the method and articles of the present invention.

*Example I*

Using the same procedure and equipment as outlined above, 25 grams of 99.9999% pure gallium and 1 gram of 99.95% pure zinc were placed in boat 23. Forty grams of 99.9995% pure arsenic were placed at the right end of the bomb tube 19. The boat 23 was placed toward the left end of the tube 19. The tube 19 was then evacuated, sealed and arranged in tube 11 and the gradient freeze furnace 17 and vapor pressure control furnace 50 as shown in the drawing. The end of the bomb tube containing the boat 23 was heated to 1245° C.–1290° C. to establish a 45° C. temperature gradient along the boat 23. The other end of the tube 19 was heated to an arsenic control temperature of 604° C. These temperature conditions were maintained for a period of five hours during which time molten gallium arsenide containing dissolved zinc formed in the boat 23. The gallium arsenide was then frozen (by slowly lowering the power to furnace 17) over an eight-hour period, all the while maintaining the temperature gradient along the boat 23. Next the boat 23 was cooled to 600° C. over a four-hour period and then the tube 19 containing the boat 23 was removed from the furnace and cooled to room temperature. After removing the gallium arsenide ingot from the bomb tube 19 and the boat 23, it was evaluated by preparing diodes by slicing and dicing the material, lapping and etching the dice and alloying a tin dot to one side of each die to form a rectifying contact and soldering (with zinc doped gold) a copper ohmic contact tab to the other side of each die. During this process it was noted that the ingot contained small gallium inclusions indicating that the melt had been gallium rich. The diodes made from this ingot were found to possess the characteristics of excellent tunnel diodes and to be suitable for such use. The carrier density of the material was found to be about $5.5\times10^{19}$ carriers per cubic centimeter. Tested at 300° Kelvin, the material had a mobility of 513 $cm.^2$ per volt second and a resistivity of $2.28\times10^{-3}$ ohm-cm.

*Example II*

Using the same procedure and equipment as Example I, 25 grams of 99.9999% pure gallium and 1 gram of 99.95% pure zinc were placed in boat 23. Forty grams of 99.9995% pure arsenic were placed at the right end of the bomb tube. An arsenic control temperature of 603° C. was used. The resulting ingot indicated growth was from a gallium rich melt. Diodes prepared from the resulting gallium arsenide material were tested and proved to be suitable for use as tunnel diodes. The carrier density of the material was about $5\times10^{19}$ carriers per cubic centimeter.

*Example III*

Using the same procedure and equipment as Example I, 28 grams of 99.9999% pure gallium and 1 gram of 99.95% pure zinc were placed in boat 23. Forty-five grams of 99.9995% pure arsenic were placed at the right end of the bomb tube. An arsenic control temperature of 604° C. was used. The resulting ingot indicated growth was from a gallium rich melt. Diodes prepared from the resulting gallium arsenide material were tested and proved to be suitable for use as tunnel diodes. The carrier density of the material was about $5\times10^{19}$ carriers per cubic centimeter.

This specification has described a new and improved diode material, and a method and apparatus for producing diodes from such material. It is realized that a study of this description will suggest to others skilled in the art new and other manners of using the principles thereof without departing from the spirit of this invention. It is, therefore, intended that this invention be limited only by the scope of the appended claims.

What is claimed is:

1. The method of making a group III—V compound semiconductor having a controlled degenerate conductivity determining impurity level therein formed of a first element and a second more volatile element, said method comprising the steps of providing a reaction chamber having at least a high temperature zone and a low temperature zone, heating in said high temperature zone a mixture of said first element and a doping agent effective to produce a degenerate conductivity determining impurity level in said compound semiconductor, said doping agent being provided in excess, providing in said low temperature zone an amount of said second element greater than that amount required to form a stoichiometric molten uompound with said first element, controlling the temperature in said low temperature zone such that at least a portion of said second element vaporizes producing the vapor pressure of said second element in said reaction chamber required to combine with said first element and form a melt of said compound semiconductor significantly rich in the group III element, controlling the temperature in said high temperature zone such that said first element and doping agent mixture are maintained above the melting temperature of said compound for a time sufficient to assure reaction between said first and said second elements to form the melt of said compound semiconductor significantly rich in the group III element, establishing a temperature gradient through said melt, lowering the temperature of said high temperature zone while maintaining said temperature gradient to freeze said melt progressively from one end to produce the controlled degenerate conductivity determining impurity level between $10^{19}$ and $5\times10^{19}$ carriers per cc. in said group III—V compound semiconductor.

2. The method of claim 1 wherein said first element is selected from the group consisting of aluminum, indium and gallium, and said second element is selected from the group consisting of phosphorus, arsenic and antimony.

3. The method of claim 2 wherein the doping agent is an element selected from the group consisting of zinc, selenium and tellurium.

4. The method of claim 1 wherein said first element is gallium, said second element is arsenic and said doping agent is zinc.

5. The method of claim 4 wherein said temperature gradient is from 20° C. to 45° C.

References Cited in the file of this patent

UNITED STATES PATENTS

| | | |
|---|---|---|
| 2,798,989 | Welker | July 9, 1957 |
| 2,871,100 | Guire et al. | Jan. 27, 1959 |
| 2,921,905 | Hung-Chi Chang | Jan. 19, 1960 |